(12) United States Patent
Yi

(10) Patent No.: US 10,553,506 B2
(45) Date of Patent: Feb. 4, 2020

(54) REPAIR METHOD AND APPARATUS FOR FLEXIBLE DISPLAY PANEL AND THE FLEXIBLE DISPLAY PANEL THEREOF

(71) Applicant: Wuhan China Star Optoelectronics Semiconductor Display Technology Co., Ltd., Wuhan, Hubei (CN)

(72) Inventor: Guoxia Yi, Guangdong (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 15/996,412

(22) Filed: Jun. 1, 2018

(65) Prior Publication Data

US 2019/0206747 A1 Jul. 4, 2019

Related U.S. Application Data

(63) Continuation of application No. PCT/CN2018/073080, filed on Jan. 17, 2018.

(30) Foreign Application Priority Data

Dec. 28, 2017 (CN) .......................... 2017 1 1471046

(51) Int. Cl.
*H01L 23/498* (2006.01)
*H01L 29/786* (2006.01)
(Continued)

(52) U.S. Cl.
CPC ........ *H01L 22/24* (2013.01); *H01L 21/02532* (2013.01); *H01L 21/02592* (2013.01);
(Continued)

(58) Field of Classification Search
CPC ................ H01L 22/24; H01L 23/4985; H01L 2251/568; G02F 1/136259; G02F 2201/508
See application file for complete search history.

(56) References Cited

U.S. PATENT DOCUMENTS

| 2014/0217383 A1* | 8/2014 | Park | ........................ H01L 51/56 257/40 |
| 2015/0235910 A1* | 8/2015 | Kim | .................. H01L 21/02675 438/5 |

(Continued)

FOREIGN PATENT DOCUMENTS

| CN | 103985823 A | 8/2014 |
| CN | 107170778 A | 9/2017 |

(Continued)

*Primary Examiner* — Evren Seven
*Assistant Examiner* — Alia Sabur
(74) *Attorney, Agent, or Firm* — Hemisphere Law, PLLC; Zhigang Ma

(57) ABSTRACT

Provided is a repair method and apparatus for flexible display panel and flexible display panel thereof. The repair method includes: providing a substrate having a first surface and an opposite second surface; forming a flexible base having bubbles bursting along the direction facing away from substrate on the first surface; forming an active layer on the flexible base for covering bubbles; forming a gate on the surface of the active layer facing away from the flexible base and irradiating the area of gate covering bubbles with laser so as to form a straight slot penetrating the active layer, the gate, and the flexible base; dripping a metallic solution into the straight slot and curing metal solution drops into conducting bodies for connecting the active layer at both sides of the slot and being isolated from gate. The repair method can address the problem of degraded display performance due to bubbles.

9 Claims, 8 Drawing Sheets

(51) Int. Cl.
*H01L 21/66* (2006.01)
*H01L 27/12* (2006.01)
*H01L 21/02* (2006.01)
*H01L 29/66* (2006.01)
*G06T 7/00* (2017.01)

(52) U.S. Cl.
CPC .... *H01L 21/02675* (2013.01); *H01L 23/4985* (2013.01); *H01L 27/1218* (2013.01); *H01L 27/1222* (2013.01); *H01L 27/1274* (2013.01); *H01L 29/66757* (2013.01); *H01L 29/78675* (2013.01); *G06T 7/0004* (2013.01); *G06T 2207/30148* (2013.01)

(56) References Cited

U.S. PATENT DOCUMENTS

2016/0254498 A1* 9/2016 Ma ................... H01L 27/3211
 438/4
2018/0173065 A1* 6/2018 Chien ............... G02F 1/136259

FOREIGN PATENT DOCUMENTS

| CN | 107367516 A | 11/2017 |
|---|---|---|
| CN | 107393874 A | 11/2017 |

* cited by examiner

REPAIR METHOD AND APPARATUS FOR FLEXIBLE DISPLAY PANEL AND THE FLEXIBLE DISPLAY PANEL THEREOF

RELATED APPLICATIONS

This application is a continuation application of PCT Patent Application No. PCT/CN2018/073080, filed Jan. 17, 2018, which claims the priority benefit of Chinese Patent Application No. 201711471046.1, filed Dec. 28, 2017, which is herein incorporated by reference in its entirety.

FIELD OF THE DISCLOSURE

The invention relates to the field of flexible display technology, and more particularly to a repair method and apparatus for flexible display panel and the flexible display panel thereof.

BACKGROUND

With the progress of flexible display technology, the manufacture of a high-caliber flexible display has become a focus for display panel manufacturers and research/design institutions. The structure of the flexible display panel is different from a glass-based display panel in that the flexible display panel uses an organic material to form the substrate. During the manufacturing process of the substrate of the flexible display panel, the liquid organic substance have to be dispensed and cured so as to form the substrate. As the organic substance in the liquid form is prone to induce bubbles, the cured substrate may contain a large number of bubbles. These bubbles will expand in the subsequent process under vacuum and hot environment. In the end, bubbles having a diameter of millimeters may come into being. The existence of these bubbles may severely affect the display performance of the flexible display panel.

SUMMARY

An object of the invention is to provide a repair method for flexible display panel for addressing the drawback of degraded display performance as a result of the generation of bubbles and efficiently enhancing the yield of the flexible display panel.

To this end, a repair method for flexible display panel is provided, which includes the steps of:

providing a substrate having a first surface and an opposite second surface;

forming a flexible base on the first surface of the substrate, in which the base includes a plurality of bubbles bursting along the direction facing away from the substrate;

forming an active layer on the flexible base for covering the bubbles;

forming a gate on the surface of the active layer facing away from the flexible base;

irradiating the area of the gate covering the bubbles with laser so as to form a straight slot penetrating through the active layer, the gate, and the flexible base;

dripping a metallic solution into the straight slot and thereby curing the dripped metallic solution drops into conducting bodies for electrically connecting the active layer at both sides of the straight slot together and being insulated from the gate.

In accordance with an embodiment of the invention, the step of dripping a metallic solution into the straight slot and thereby curing dripped metallic solution drops into conducting bodies for electrically connecting the active layer at both sides of the straight slot together and being insulated from the gate further includes sub-steps of:

forming an insulating portion on each conducting body;

dripping a metallic solution into the insulating portion and thereby curing dripped metallic solution drops into a connecting body for electrically connecting to the gate at both sides of the straight slot.

In accordance with an embodiment of the invention, the step of dripping a metallic solution into the straight slot and thereby curing dripped metallic solution drops into conducting bodies for electrically connecting the active layer at both sides of the straight slot together and being insulated from the gate further includes sub-steps of:

forming an insulating portion on each conducting body;

forming a first metallic layer on the gate for covering the insulating portion;

patterning the first metallic layer to form a connecting body for electrically connecting to the gate.

In accordance with an embodiment of the invention, the metallic solution is silver paste.

In accordance with an embodiment of the invention, the metallic solution is silver paste.

In accordance with an embodiment of the invention, the metallic solution is silver paste.

In accordance with an embodiment of the invention, the step of forming an active layer on the flexible base further includes sub-steps of:

forming an amorphous silicon (a-Si) layer on the flexible base and irradiating the amorphous silicon layer with laser so as to form an active layer.

In accordance with an embodiment of the invention, the step of forming an active layer on the flexible base further includes sub-steps of:

forming a buffer layer on the flexible base;

forming a dielectric layer on the buffer layer and forming an amorphous silicon layer on the dielectric layer, and irradiating the amorphous silicon layer with laser to form the active layer.

In accordance with an embodiment of the invention, the step of forming a flexible base having a plurality of bubbles on the first surface includes the sub-steps of:

forming a first flexible film on the first surface;

forming an isolating layer on the first flexible film;

forming a second flexible film on the isolating layer.

The invention also provides a repair apparatus for flexible display panel for repairing flexible display panel with bubbles, in which the flexible display panel with bubbles includes a substrate, a flexible base, an active layer, and a gate, all of which are sequentially stacked up. The repair apparatus includes: a laser, an image sensor, and a metallic solution burette device. The laser, the image sensor, and the metallic solution burette device are aligned with the area of the gate covering the bubbles. The laser is configured to melt down the areas of flexible base, the active layer, and the gate covering bubbles, and thereby forming a straight slot penetrating through the flexible base. The metallic solution burette device is configured to drip a metallic solution into the straight slot so as to allow the active layer at both side of the straight slot to be electrically connected together. The image sensor is configured to inspect the thickness of the dripped metallic solution drops.

The invention also provides a flexible display panel, which includes a conducting body, as well as a substrate, a flexible base, an active layer, and a gate, all of which are sequentially stacked up. The conducting body is embedded within the flexible display panel. One surface of the conducting body abuts against the substrate, and the other surface of the conducting body is located within the active layer. The conducting body is configured to electrically connect the active layer and insulated from the gate.

In accordance with an embodiment of the invention, an insulating portion and a connecting body are sequentially stacked upon the conducting body. The connecting body is configured to electrically connecting the gate at both side of the connecting body. The insulating portion is configured to insulate the conducting body from the connecting body.

The embodiment of the invention uses laser to irradiate the area of the gate covering bubbles so as to melt down the areas of the gate, the active layer, and the flexible base covering bubbles, thereby forming a straight slot. Also, a metallic solution is dripped into the straight slot and the dripped metallic solution drops are cured into a conducting body, so as to connect the active layer separated by the straight slot. Therefore, the flexible display panel can be protected from being short-circuited, and the display performance of the flexible display panel is enhanced.

BRIEF DESCRIPTION OF THE DRAWINGS

To illustrate the technological scheme embodying the embodiment of the invention in a clear manner, the accompanying drawings showing the embodiment of the invention will be briefed in the following. Apparently, the accompanying drawings stated below are merely affiliated to some embodiments of the invention. An artisan having ordinary skill in the art can devise other drawings based on the accompanying drawings without exerting non-inventive laboring. In the figures.

DETAILED DESCRIPTION OF PREFERRED EMBODIMENTS

Figure 1:
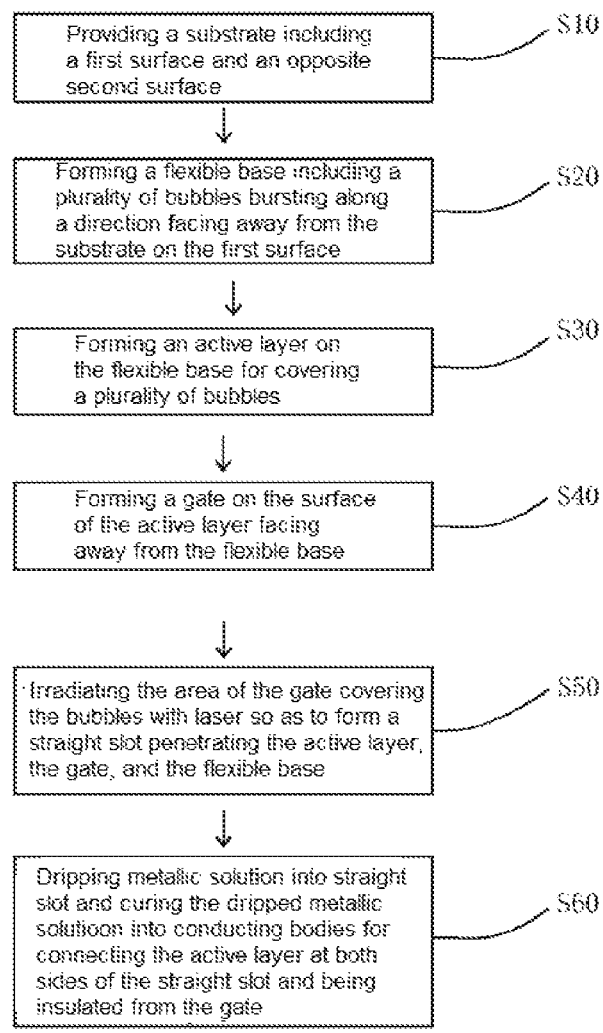
FIG. 1 is a flow chart illustrating the repair method for flexible display panel according to an embodiment of the disclosure.

FIG. 1 shows the procedural flow of the repair method for flexible display panel according to the invention. The repair method of the invention is used to repair the surface defects of the flexible display panel for addressing the problem that the display performance of the flexible display panel would be degraded as a result of the generation of bubbles. Hence, the yield of the flexible display panel can be enhanced. In this embodiment, the repair method for flexible display panel includes, but not limited to, steps S10, S20, S30, S40, S50, and S60. Each step is explicated as follows:

In the step S10, a substrate 10 is provided, which includes a first surface 11 and an opposite second surface 12.

Figure 2:
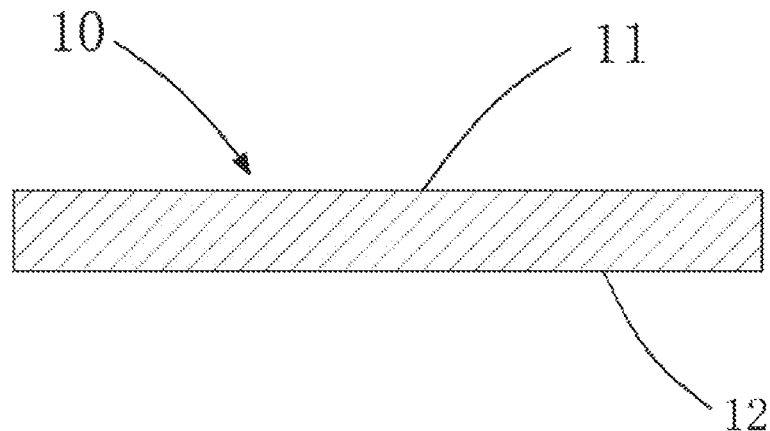
FIG. 2 and FIG. 3 are cross-sectional views showing the partial cross-section of the flexible display panel involved with the steps S10 and S20 of FIG. 1.

As shown in FIG. 2, the substrate 10 may include a transparent substrate such as a glass substrate. The substrate 10 includes a first surface 11 and a second surface 12, both of which are disposed in opposite to each other. The meaning of the phrase "opposite" indicates that both surfaces are set to be against each other. In this embodiment, the context here means that the first surface 11 and the second surface 12 are two "planes" that are set to be against each other. The first surface 11 and the opposite second surface 12 of the substrate 10 are set to maintain their cleanness and evenness by rinse or surface processing. This can facilitate the subsequent processes for fabricating thin-film transistors with an uniform thickness, and protect the substrate 10 from containing impurity and affecting the electrical performance of the thin-film transistors.

In the step S20, a flexible base 20 is formed on the first surface 11. The flexible base 20 includes bubbles bursting along the direction facing away from the substrate 10.

Figure 3:
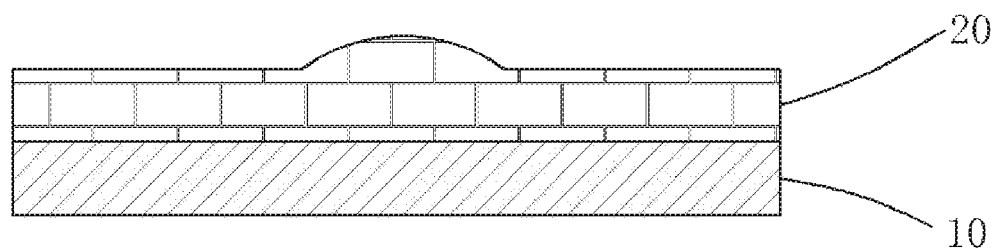

In this embodiment, as shown in FIG. 3, a layer of polymeric solution is uniformly coated on the first surface 11 of the substrate 10. The polymeric solution is a polyimide solution. The polymeric solution has a high tolerable temperature. The first surface 11 of the substrate 10 which is coated with a layer of polyimide solution is placed in a high-temperature oven for baking, so as to cure the polyimide solution into a flexible base 20. The thickness of the flexible base 20 is 10 micrometers. The coating method may include spin coating process, knife coating process, or ink printing process. The coating method can ensure that the flexible base 20 is evenly adhered to the substrate 10 and is able to real-time control the thickness of the cured polyimide solution. In addition, as the polyimide solution contains bubbles, the flexible base 20 may contain bubbles embedded therein. In other embodiment, other polymeric solutions, such as polyethylene solution or polyethylene terephthalate solution, may be used.

Figure 4:
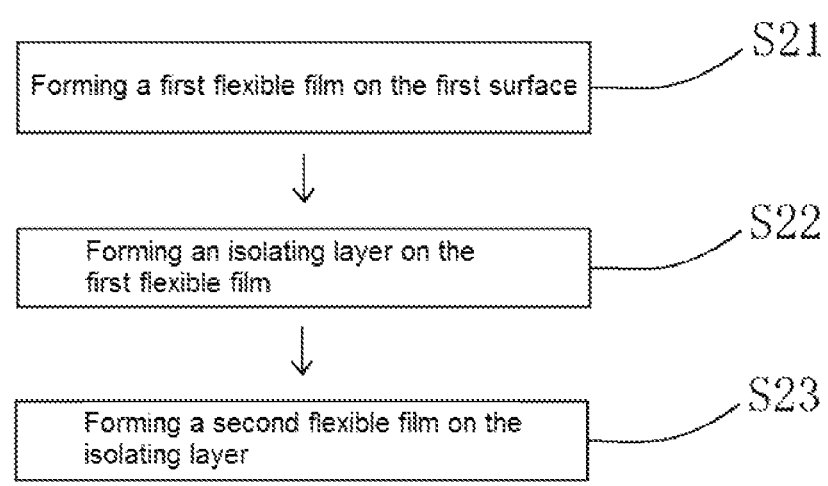
FIG. 4 is a flow chart illustrating the sub-steps of the step S20 of FIG. 1.
Figure 5:
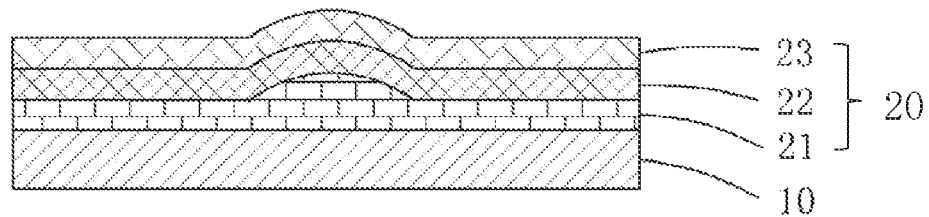
FIG. 5 is a cross-sectional diagram of the flexible base formed through the steps S21, S22, and S23 of FIG. 4.

Please refer to FIG. 4 and FIG. 5. In the step S20, a flexible base 20 containing a plurality of bubbles is formed on the first surface 11. In the figures, the sub-step S21 is first performed, in which:

S21: forming a first flexible film 21 on the first surface 20.

In this embodiment, the first surface 11 of the substrate 10 is uniformly coated with a layer of polymeric solution. The polymeric solution is polyimide solution. The polyimide solution coated on the first surface 11 of the substrate 10 is then cured into a first flexible film 21. As the polyimide solution contains bubbles, the first flexible film 21 also contains bubbles embedded therein. The bubbles will burst along the direction facing away from the substrate 10. In other embodiments, the first flexible film 21 may be made up of polyethylene solution or polyethylene terephthalate solution.

Next, in the step S22, an isolating layer 22 is formed on the first flexible film 21.

In this embodiment, an isolating layer 22 is deposited on the first flexible film 21. The material of the isolating film 22 may be, but not limited to, silicon nitride, silicon oxide, or a combination of them. The isolating layer 22 is used to prevent moisture or oxygen from entering the flexible display panel and degrading the display function of the flexible display panel.

Next, in the step S23, a second flexible film 23 is formed on the surface of the isolating layer 22.

In this embodiment, a polymeric solution is uniformly coated on the isolating layer 22. The polymeric solution is polyimide solution. The polyimide solution coated on the isolating layer 22 is then cured into a second flexible film 23. As the polyimide solution contains bubbles, the second flexible film 23 also contains bubbles embedded therein. The bubbles will burst along the direction facing away from the substrate 10. By forming a second flexible film 23 on the isolating layer 22, the flexible base 20 reaches planarization and thus improves its uniformity and flexibility. In other embodiments, the second flexible film 23 may be made up of polyethylene solution or polyethylene terephthalate solution.

Next, in the step S30, an active layer 30 is formed on the flexible base 20, in which the active layer 30 covers the bubbles.

Figure 6:
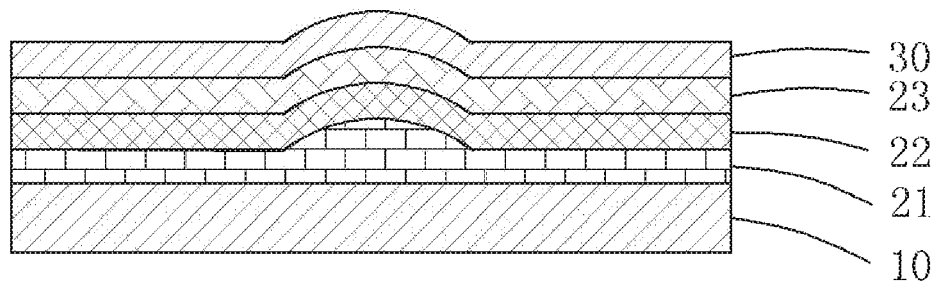
FIG. 6 is a partial cross-sectional diagram of the flexible display panel for illustrating the step S30 of FIG. 1.

As shown in FIG. 6, an active layer 30 is formed on the flexible base 20, The active layer 30 serves as the communication channel for the thin-film transistors of the flexible display panel. If the active layer 30 is open-circuited for some reason, the electric signals of the source and the electric signals of the drain can not be transmitted normally, Because the active layer 30 is manufactured under vacuum and high-temperature environment, the bubbles in the flexible base 20 would expand so as to make the level of the area of the active layer 30 deposited on bubbled portion of the flexible base 20 higher than the level of the area of the active layer 30 deposited on the bubble-less portion of the flexible base 20. In this way, a protrusion is formed on the flexible display panel.

In this embodiment, an amorphous silicon (a-Si) layer is formed on the flexible base 20. The amorphous silicon layer is then converted into a polysilicon layer by excimer laser annealing. The polysilicon layer is the active layer 30. Concretely speaking, an amorphous silicon layer is formed on the flexible base 20 and then is irradiated with Xenon monochloride (XeCl) laser so as to be converted into polysilicon layer.

Figure 7:
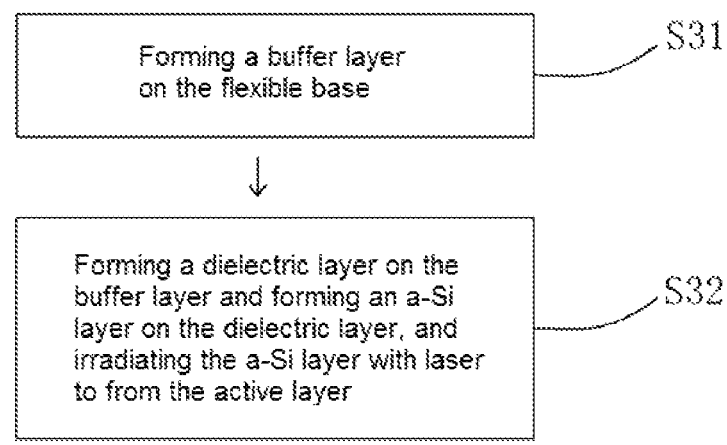
FIG. 7 is a flow chart illustrating the sub-steps of the step S30 of FIG. 1.
Figure 8:
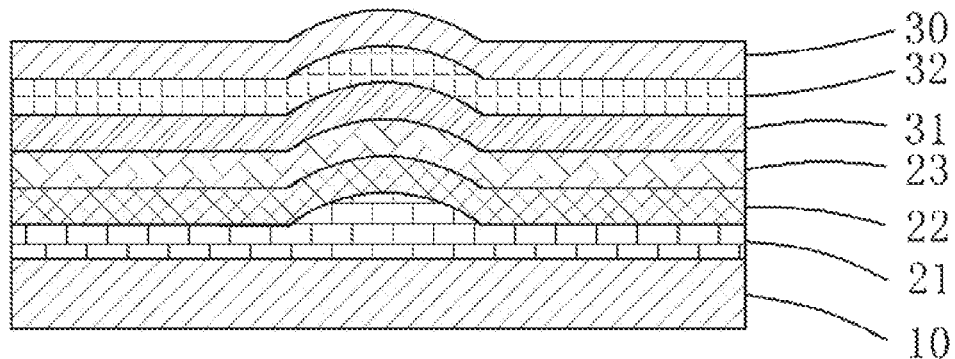
FIG. 8 is a cross-sectional diagram showing the cross section of the buffer layer and the dielectric layer formed through the steps S31 and S32 of FIG. 7.

Please refer to FIG. 7 and FIG. 8. In the step S30, an active layer 30 is formed on the flexible base 20. In these figures, the step S31 is performed first, in which:

S31: forming a buffer layer 31 on the flexible base 20.

In this embodiment, a buffer layer 31 is deposited on the flexible base 20 by plasma enhanced chemical vapor deposition process. The material of the buffer layer 31 may include, but not limited to, silicon nitride. The buffer layer 31 may be manufactured by forming a silicon nitride film by plasma enhanced chemical vapor deposition process using a mixed gas of silane and ammonia as the reactant gas and glow discharge process for forming a film on the flexible base. The buffer layer 31 is used to isolate the outside moisture and oxygen, thereby avoiding the display function from being degraded.

Next, in the step S32, a dielectric layer 32 is formed on the buffer layer 31, and an amorphous silicon layer is formed on the dielectric layer 32, and the amorphous silicon layer is irradiated with laser to form the active layer 30.

In this embodiment, the dielectric layer 32 is formed on the buffer layer 31 by plasma enhanced chemical vapor deposition process. The material of the dielectric layer 32 may include, but not limited to, silicon oxide. The dielectric layer 32 is used to flex the dielectric coefficient of the display panel.

Figure 9:
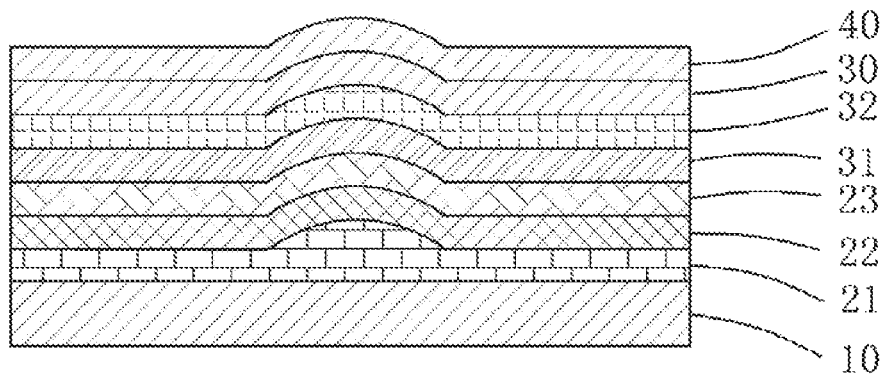
FIGS. 9-12 are partial cross-sectional diagrams of the flexible display panel for illustrating the steps S40, S50, and S60 of FIG. 1.

Next, the step S40 is performed to form a gate 40 on the surface of the active layer 30 facing away from the flexible base 20, as shown in FIG. 9.

In this embodiment, a second metallic layer is formed on the active layer 30. The second metallic layer covers the active layer 30. Concretely speaking, the second metallic layer is deposited on the active layer 30 by magnetron sputtering process. The material of the second metallic layer may include, but not limited to, copper, molybdenum, niobium, aluminum, or an alloy of at least two of these metals. The second metallic layer is then patterned so as to form a gate 40. Concretely speaking, the second metallic layer is etched to form a gate 40 by photolithography and etching processes. The gate 40 is used to connect to and receive a scanning control signal inputted thereto for controlling ON/OFF operations of the thin-film transistor.

It should be understood that according to the invention the patterning process is directed to a picture composition process, which may include a photolithography process, or a photolithography process plus an etching process. In the meantime, the patterning process may be directed to an ink printing process, an etching process, or other process for forming a predetermined pattern. The photolithography process includes a masking process, an exposure process, and a development process for forming a pattern. The etching process includes wet etching process which is done by etching a metallic film using an acid solution, and dry etching process which is done by etching a metallic film using plasma. A person skilled in the art can select a desired etching mode appropriate for the structure formed according to the invention. The magnetron sputtering process is done by ramming high-energy gaseous ions in the plasma which is generated by a RF power supply or a DC power supply to the surface of the target, so that particles are emitted from the surface of the target and adhered to the substrate 10.

Figure 10:
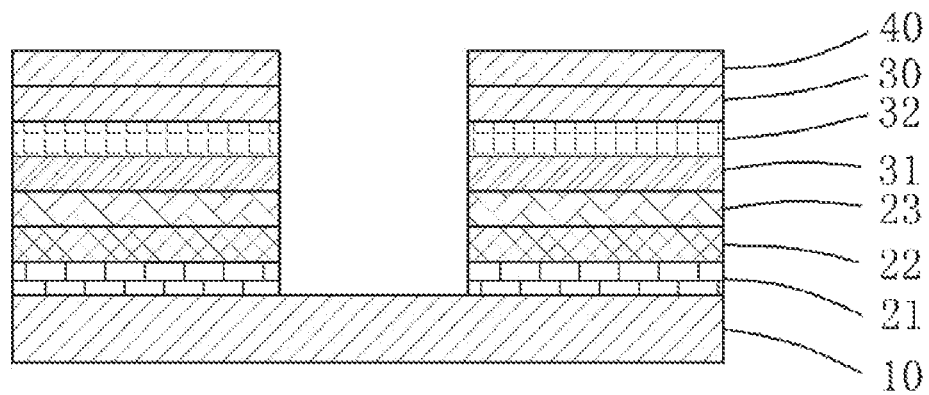

Next, in the step S50, the area of the gate 40 covering bubbles is irradiated with laser, so as to form a straight slot penetrating the active layer 30, the gate 40, and the flexible base 20, as shown in FIG. 10.

In this embodiment, as the active layer is manufactured under high-temperature and vacuum environment, the bubbles in the flexible base 20 would expand to make the level of the area of the active layer 30 deposited on the bubbled portion of flexible base 20 is higher than the area of the active layer 30 deposited on the bubble-less portion of the flexible base 20. Further, as the gate 40 is manufactured under high-temperature and vacuum environment, the bubbles in the flexible base 20 would further expand to make the level of the area of the active layer 30 and the area of the gate 40 that are deposited on the bubbled location higher than a standard level, thereby forming a protrusion. Hence, the area of the gate 40 deposited on the bubbled location is irradiated with laser to form a straight slot penetrating the flexible base 20, the active layer 30, and the gate 40. Concretely speaking, the laser with a wavelength of 1064 nm, 532 nm, 355 nm, or 266 nm is used to irradiate the protrusion, thereby melting down the portions of the flexible base 20, the active layer 30, and the gate corresponding to the bubbles. In this way, the influence on the yield of the flexible display panel as a result of the protrusion caused by the bubbles in the flexible display panel can be neutralized. In other embodiments, the wavelength of the laser is not to be limited.

Figure 11:
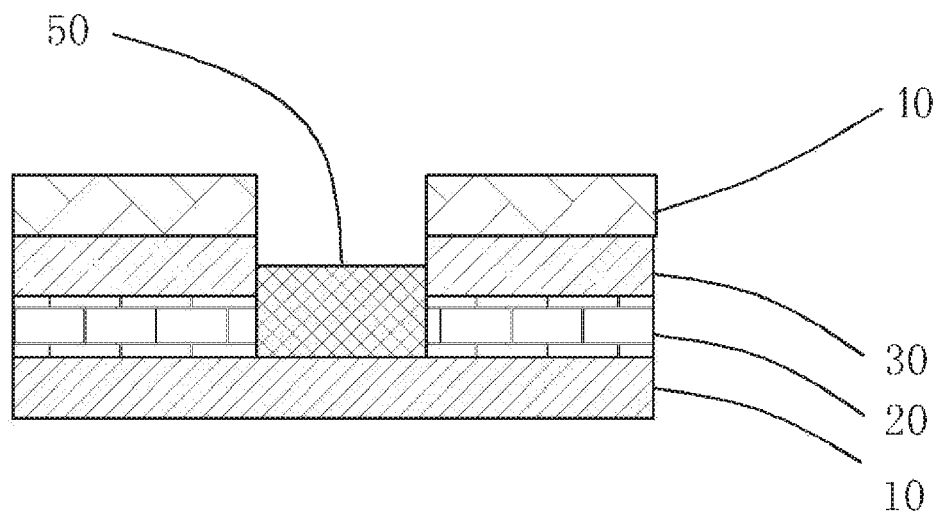
Figure 12:
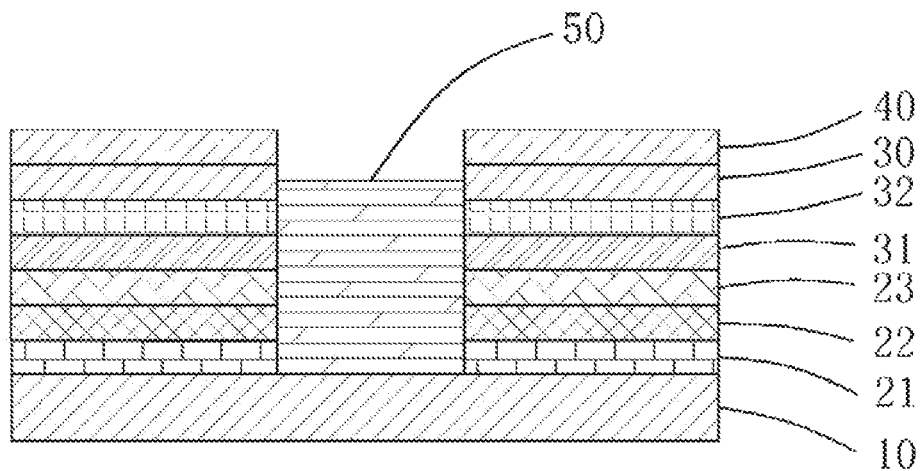

Next, in the step S60, a metallic solution is used to drip metallic solution drops into the straight slot. The metallic solution drops are cured into conducting bodies 50. A plurality of conducting bodies 50 would electrically connect the active layer at both sides of the straight slot and be insulated from the gate 40, as shown in FIG. 11 and FIG. 12.

In this embodiment, as the area of the gate covering bubbles is irradiated with laser, a plurality of straight slots are generated on the flexible display panel. These straight slots would seriously affect the electrical performance of the flexible display panel. Under this condition, a metallic solution such as silver paste is used to drip metallic solution drops into the straight slots, Here, silver paste is chosen to be the metallic solution because silver has excellent conductivity and is quite cheap. The silver paste is cured into conducting bodies 50 for connecting the active layer 30 at both sides of the straight slot together and being insulated from the gate 40. The surface of the conducting body 50 is lower than the surface of the active layer 30 facing away from the flexible base 20. In this way, the silver paste is able to connect the separated active layer so as to prevent the flexible display panel from being open-circuited. Thus, the display performance of the flexible display panel is enhanced. Also, the conducting bodies 50 may fill up the flexible base 20, so that the integrity of the flexible display panel can be guaranteed and the overall aesthetic view of the flexible display panel is promoted. In addition, because the thickness of the flexible base 20 is 10 micrometers, the depth of the straight slot will be larger than 10 micrometers. This may prohibit the electrodes from being deposited in the straight slot in their entirety in the subsequent nano-scale electrode deposition process and causing the electrodes to be open-circuited. Hence, the display performance of the flexible display panel is significantly enhanced. In other embodiments, other metallic solution than silver paste may be used, and it is not intended to limit the type of the metallic solution to the precise type disclosed herein.

Figure 13:
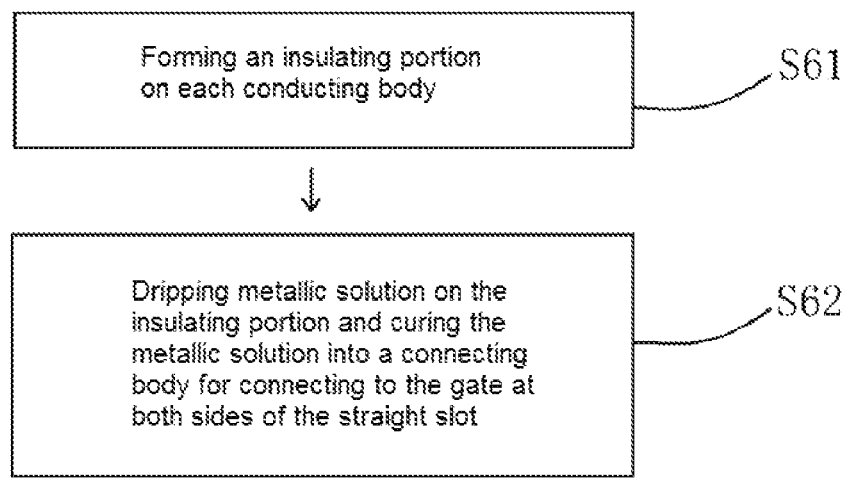
FIG. 13 is a flow chart illustrating the sub-steps of the step S60 of FIG. 1 according to a first embodiment of the invention.
Figure 14:
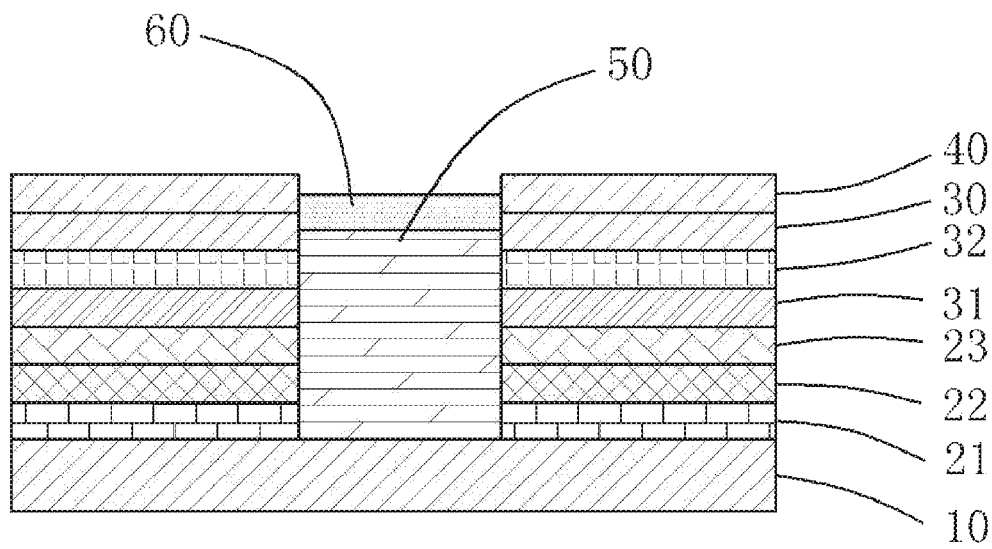
FIG. 14 and FIG. 15 are partial cross-sectional diagrams of the flexible display panel formed through the steps S61 and S62 of FIG. 13.
Figure 15:
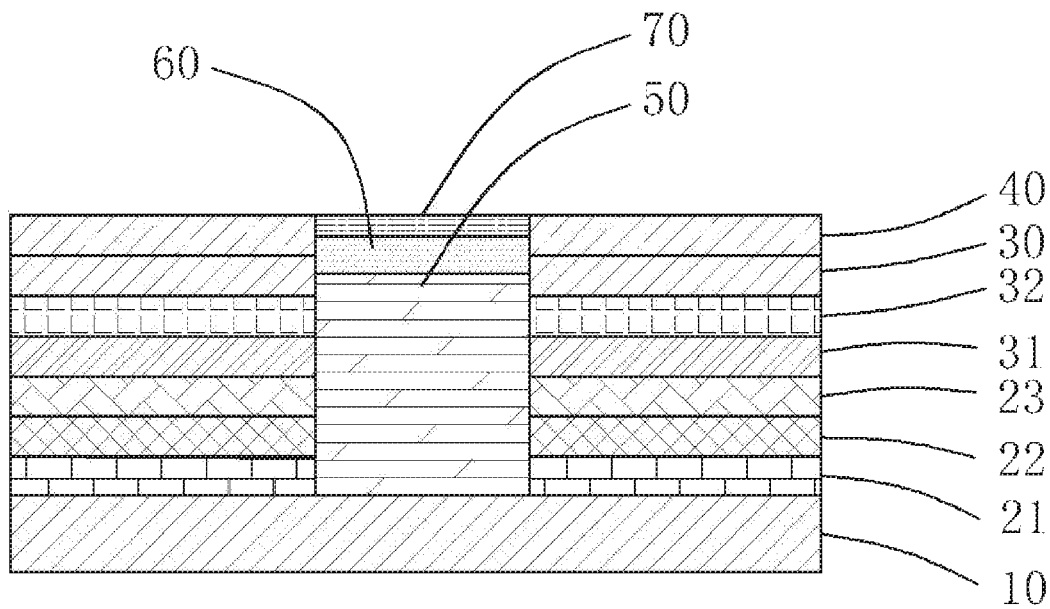

In a first embodiment of the invention, as shown in FIGS. 13-15, a metallic solution is used to drip metallic solution drops into the straight slot. The metallic solution drops are cured into conducting bodies 50. A plurality of conducting bodies 50 are configured to connect the active layer 30 at both sides of the straight slot and are insulated from the gate 40. Next, the step S61 is performed, in which:

Step S61: forming an insulating portion 60 on each conducting body 50.

In this embodiment, as shown in FIG. 14, an insulating layer is formed on the conducting body 50 by a plasma-enhanced chemical vapor deposition process for covering the conducting body 50. The thickness of the insulating layer may be precisely controlled. Alternatively, the insulating layer is located in the gate 40. That is, the surface of the insulating layer is lower than the surface of the gate 40. In this way, the connecting body 70 is restrained from protruding from the straight slot in the subsequent filling process for the connecting body 70. Thus, the thickness of the gate 40 may be refrained from increasing. In other embodiments, the insulating portion 60 may fill up the straight slot depending on practical conditions. The material of the insulating layer may include, but not limited to, silicon oxide, silicon nitride, or a combination of them.

Next, in the step S62, a metal solution is used to drip metal solution drops into the surface of the insulating portion 60. The metallic solution drop is then cured into a connecting body 70 for connecting to the gate 40.

In this embodiment, a connecting body 70 is formed on the insulating portion 60 for connecting the separated gate 40. Alternatively, when the surface of the insulating portion 60 is located in the gate 40, it is desired to keep dripping silver paste into the straight slot so as to cure the silver paste drops into a connecting body 70. Because silver has excellent conductivity, it may provide a good electrical connection for the gate and guarantee the integrity of the gate. Also, the stability and security of the gate 40 may be protected from being lowered due to the straight slot formed on its surface. Moreover, the flexible display panel may be protected from being open-circuited. In other embodiments, when the insulating portion 60 fills up the straight slot, a metallic layer may be deposited on the insulating portion 60, in which the material of the metallic layer is the same with the material of the gate 40. Thus, the gate 40 cleaved by the straight slot can be electrically connected to ensure the stability of the gate 40. This connecting body 70 can be securely affixed to the surface of the gate 40 to ensure the stable connection of the gate 40.

Figure 16:
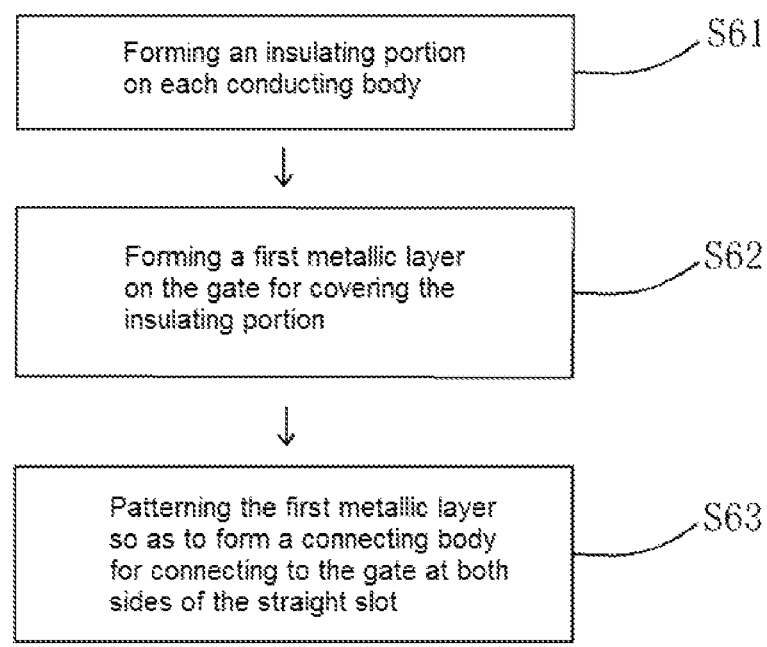
FIG. 16 is a flow chart illustrating the sub-steps of the step S60 of FIG. 1 according to a second embodiment of the invention.

Please refer to FIG. 16. In a second embodiment of the invention, at the step S60 a metal solution is dripped into the straight slot. The dripped metal solution drops are cured into conducting bodies 50. A plurality of conducting bodies 50 electrically connect the active layer 30 at both sides of the straight slot and are insulated from the gate 40. Next, step S61 is performed, in which:

S61: forming an insulating portion 60 on each conducting body 50.

In this embodiment, the structure of the insulating portion 60 is the same with the structure of the insulating portion 60 of the first embodiment, so it is not intended to give details herein.

Next, in the step S62, a first metallic layer is formed on the gate 40 for covering the insulating portion 60.

In this embodiment, a metallic thin film is deposited on the gate 40 by the magnetron sputtering process so as to form the first metallic layer. The first metallic layer may be made up of copper, Molybdenum, Chromium, aluminum, or an allot of at least two of these metals.

Next, in the step S63, the first metallic layer is patterned to form a connecting body 70 for connecting to the gate 40.

In this embodiment, the pattern for forming the thin-film transistors is formed on the surface of the gate 40 by the photolithography process. Because the connecting body 70 possesses good conductivity, the gate 40 is able to attain electrical connection, thereby assuring the integrity of the gate electrode 40. Also, this can protect the gate 40 from losing its stability and firmness due to the straight slot formed on the surface of the gate 40.

In this embodiment, the area of the gate covering the bubbles is irradiated with laser, such that the bubbled portions of the gate 40, the active layer 30, and the flexible base 20 are melted down so as to form the straight slot. Moreover, metallic solution drops are added into the straight slot and cured into conducting bodies 50 for connecting the active layer 30. In this way, the problem that the display performance of the flexible display panel become degraded as a result of the bubbles can be eliminated. In addition, an insulating portion 60 and a connecting body 70 are formed on the conducting body 50 for preventing the conducting body 50 from being electrically connected to the gate 40 and allowing the gate 40 to attain electrical connection through the connecting body 70. This can assure the integrity of the gate and the stability of electrical connection, and prevent the gate 40 from lowering its firmness as a result of the straight slot formed thereon.

Figure 17:
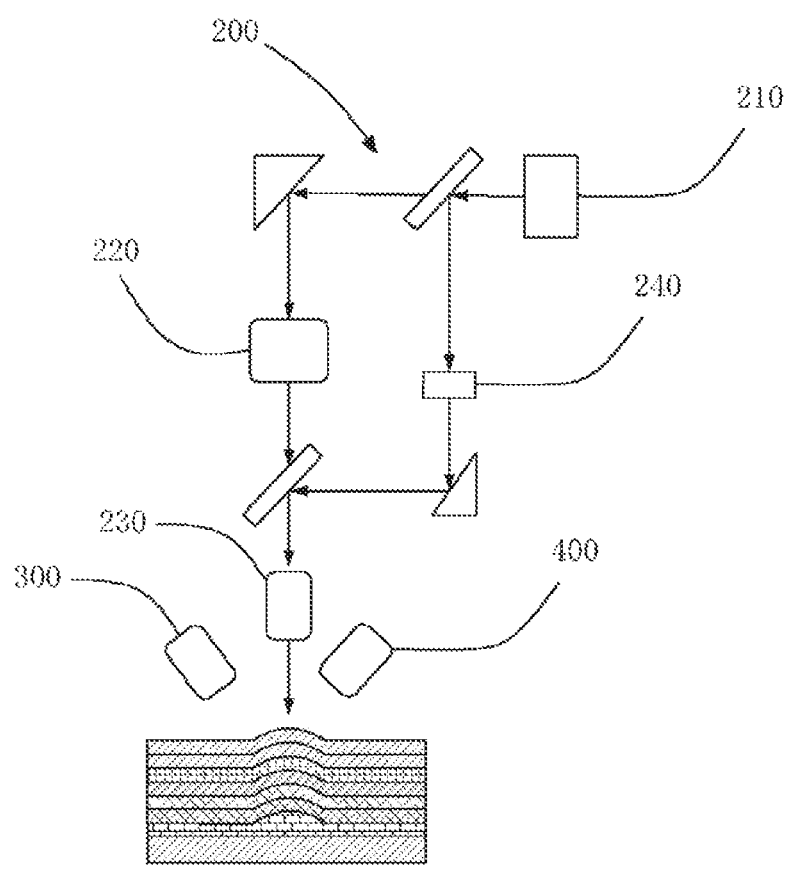
FIG. 17 is a schematic diagram showing the structure of the repair apparatus for flexible display panel according to an embodiment of the invention.

Please refer to FIG. 17, which shows a repair apparatus for flexible display panel. The repair apparatus is used to repair flexible display panel with bubbles. The flexible display panel includes a substrate 10, a flexible base 20, an active layer 30, and a gate 40, all of which are sequentially stacked up. The repair apparatus for flexible display panel includes: a laser 200, an image sensor 300, and a metallic solution burette device 400. The laser 200, the image sensor 300, and the metallic solution burette device 400 align with the area of the gate covering the bubbles. The laser 200 is used to melt down the bubbled portions of the flexible base 20, the active layer 30, and the gate 40 so as to form a straight slot penetrating the flexible base 20. The metallic solution burette device 400 is used to drip metallic solution into the straight slot for electrically connecting the active layer at both sides of the straight slot. The image sensor 300 is used to project image to the bubbles for inspecting the thickness of the dripped metallic solution drops.

Concretely speaking, the laser includes a laser exciter 210, an energy collector 220, a lens 230, and an energy converter 240. The laser exciter 210 emits laser light, which is reflected by a prism and received by the energy collector 240 so as to be proceeded with energy conversion. Afterwards, the laser light is re-emitted to the lens 230 and transmitted through the lens 230, so as to irradiate the bubbled portions of the flexible display panel, thereby melting down the flexible base 20, the active layer 30, and the gate 40. Part of the laser light transmitted through the prism is collected by the energy collector 220, and the collected laser light is transmitted to the lens 230 for melting down the bubbled area of the gate. When the bubbled flexible display panel is melted down so as to form a straight slot, the metallic solution burette device 400 is used to drip a metallic solution into the straight slot for connecting the active layer 30 of the flexible display panel. Next, the image sensor 300 is used to inspect the height of the metallic solution so as to fill the metallic solution in the predetermined positions in the straight slot.

In this embodiment, the bubbled portions of the flexible base 20, the active layer 30, and the gate 40 are melted down by the laser 200 so as to form a straight slot. Also, the image sensor 300 and the metallic solution burette device 400 are used to drip a metallic solution into the straight slot. In this way, the active layer of the flexible display panel is electrically connected. When the metallic solution is filled in the straight slot in the the flexible base 20, the occurrence of open circuit can be avoided in the subsequent process for manufacturing the electrode. The flexible display panel of the invention is able to attain electrical connection for the active layer 30 and electrical connection for the electrode, thereby enhancing the display performance of the flexible display panel.

Please refer to FIG. 12. The invention provides a flexible display panel, which includes a conducting body 50, and a substrate 10 a flexible base 20, an active layer 30, and a gate 40, all of which are sequentially stacked up. The conducting body 50 is embedded within the flexible display panel. One surface of the conducting body 50 abuts against the substrate 10, and the other surface of the conducting body 50 is located in the active layer 30. The conducting body 50 is used to electrically connect the active layer 30 and is insulated from the gate 40.

In this embodiment, the flexible display panel is able to connect the active layer 30 in the flexible display panel through the conducting body 50. This can prevent the display performance of the flexible display panel from being affected due to the open circuit of the active layer 30.

Please refer to FIG. 15. The invention provides a flexible display panel, which includes a conducting body 50, an insulating portion 60 mounted on the conducting body 50, a connecting body 70 mounted on the insulating portion 60, as well as a substrate 10, a flexible base 20, an active layer 30, and a gate 40, all of which are sequentially stacked up. The conducting body 50 is embedded within the flexible display panel. One surface of the conducting body 50 abuts against the substrate 10, and the other surface of the conducting body 50 is located in the active layer 30. The conducting body 50 is used to electrically connect the active layer portions 30 and is isolated from the gate 40. The connecting body 70 is used to electrically connect to the gate 40.

In this embodiment, the flexible display panel is able to connect the active layer 30 of the flexible display panel together through the conducting body 70. This can prevent the display performance of the flexible display panel from being affected due to the open circuit of the active layer 30. Also, an insulating portion 60 and a connecting body 70 are mounted on the surface of the conducting body 50. This can prevent the conducting body 50 from being connected to the gate 40. Also, this can allow the gate 40 to attain electrical connection through the connecting body 70. This can assure the integrity and the stability of electrical connection of the gate 40, and prevent the firmness of the gate 40 from being reduced due to the straight slot formed thereon.

The above descriptions only discloses a preferred embodiment of the invention. However, the preferred embodiment can not be taken to limit the scope of the invention. An artisan having ordinary skill in the art can understand the way to embody the foregoing embodiment, and the equivalent modifications which are made based on the claims are still within the scope of the invention.

What is claimed is:

1. A repair method for flexible display panel, comprising the steps of:
   providing a substrate having a first surface and a second surface, both of which are opposite to each other;
   forming a flexible base on the first substrate, the flexible substrate comprises a plurality of bubbles which extend along a direction facing away from the substrate;
   forming an active layer on the flexible base for covering the bubbles;
   forming a gate on a surface of the active layer facing away from the flexible base;
   irradiating an area of the gate covering the bubbles with laser so as to form a straight slot penetrating the active layer, the gate, and the flexible base; and
   dripping a metallic solution into the straight slot and curing metallic solution drops in the straight slot into conducting bodies for electrically connecting the active layer at both sides of the straight slot and which are insulated from the gate.

2. The repair method according to claim 1, wherein the step of dripping a metallic solution into the straight slot and curing metallic solution drops in the straight slot into conducting bodies for electrically connecting active layer at both sides of the straight slot and which are insulated from the gate includes sub-steps of:
   forming an insulating portion on the conducting body;
   dripping the metallic solution on the insulating portion and curing metallic solution drops on the insulating portion into a connecting body for electrically connecting to the gate at both sides of the straight slot.

3. The repair method according to claim 1, wherein the step of dripping a metallic solution into the straight slot and curing metallic solution drops in the straight slot into conducting bodies for electrically connecting the active layer at both sides of the straight slot and which are insulated from the gate includes sub-steps of:

forming an insulating portion on the conducting body;

forming a first metallic layer of the gate for covering the insulating portion;

patterning the first metallic layer to form a connecting body for electrically connecting to the gate at both sides of the straight slot.

4. The repair method according to claim 1, wherein the metallic solution is silver paste.

5. The repair method according to claim 2, wherein the metallic solution is silver paste.

6. The repair method according to claim 3, wherein the metallic solution is silver paste.

7. The repair method according to claim 4, wherein the step of forming an active layer on the flexible base include sub-steps of:

forming an amorphous silicon layer on the flexible base and irradiating the amorphous silicon layer with laser to form an active layer.

8. The repair method according to claim 5, wherein the step of forming an active layer on the flexible base include sub-steps of:

forming a buffer layer on the flexible base; and forming a dielectric layer on the buffer layer and forming an amorphous silicon layer on the dielectric layer, and irradiating the amorphous silicon layer with laser so as to form an active layer.

9. The repair method according to claim 6, wherein the step of forming a flexible base having a on the first substrate includes sub-steps of:

forming a first flexible film on the first surface;

forming an isolating layer on the first flexible film; and forming a second flexible film on the isolating layer.

\* \* \* \* \*